United States Patent [19]
Dowling et al.

[11] Patent Number: 6,099,579
[45] Date of Patent: Aug. 8, 2000

[54] METHOD AND APPARATUS FOR CHECKING ASYNCHRONOUS HDL CIRCUIT DESIGNS

[75] Inventors: Brian Michael Dowling, El Dorado Hills; James David Rodeo, Citrus Heights, both of Calif.

[73] Assignee: Hewlett-Packard Company, Palo Alto, Calif.

[21] Appl. No.: 08/943,085

[22] Filed: Oct. 2, 1997

[51] Int. Cl.$^7$ .................................................. G06F 17/50
[52] U.S. Cl. ..................... 716/6; 716/5; 716/18
[58] Field of Search ................... 395/500.06, 500.35, 395/500.36, 500.19, 500.04, 500.07

[56] References Cited

U.S. PATENT DOCUMENTS

| | | | |
|---|---|---|---|
| 5,581,781 | 12/1996 | Gregory et al. | 395/500.19 |
| 5,650,938 | 7/1997 | Bootehsaz et al. | 395/500.07 |
| 5,664,181 | 9/1997 | Velissaropoulos et al. | 707/102 |
| 5,737,574 | 4/1998 | Gregory et al. | 711/162 |
| 5,748,488 | 5/1998 | Gregory et al. | 395/500.19 |
| 5,854,926 | 12/1998 | Kingsley et al. | 717/9 |
| 5,864,487 | 1/1999 | Merryman et al. | 395/500.07 |

Primary Examiner—Paul R. Lintz
Assistant Examiner—Vuthe Siek

[57] ABSTRACT

A tool is provided that automates and expedites the ASIC design review process by allowing designers to perform a comprehensive asynchronous path design review of the circuit design HDL code. The tool operates on either an entire hierarchy or any sub-block of the circuit design. Filters are provided to allow the user to disregard known and desired synchronization circuits from the output generated by the tool. The tool provides an output that can take either of two formats, i.e. the output may be presented in a tabular form by hierarchical signal name, or it may be presented in a graphical, schematic block diagram form. In operation, the tool performs an exhaustive search of all circuits and identifies any asynchronous behavior. A user interface is provided that requires two data inputs and provides for an additional optional field. The two mandatory fields identify the location of all design files and the module at which the tool should begin its analysis. The tool begins its analysis at the level of the module input and traverses the circuit design from that point down the hierarchy to all end modules. Additional options and inputs govern the type and format of output information generated.

23 Claims, 5 Drawing Sheets

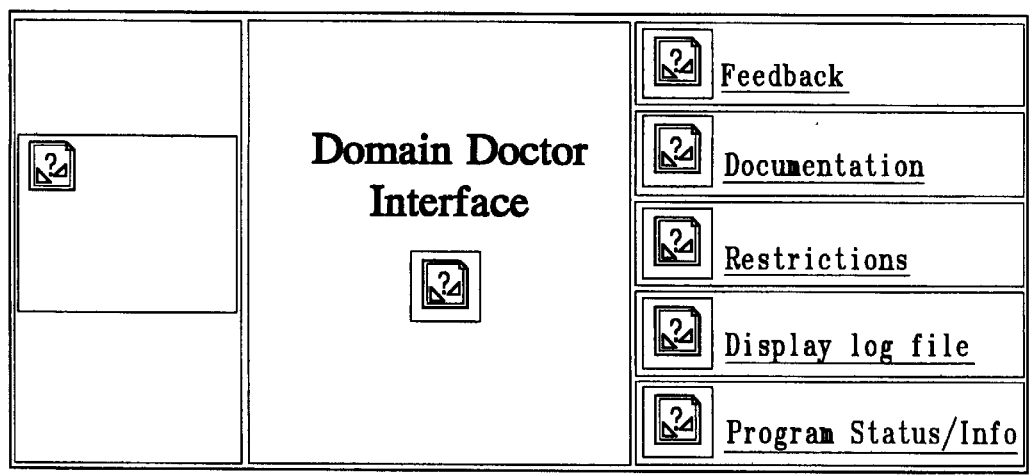

Path: /mnt/hci4/ddr/     Filename: ddr.v

Display Options (Click on option for help):

- ☐ Display all signals
  - ☐ Display double synchronous flops
  - ☒ Display domain crossing  ☐ (Exclude tagged synchronous flops)
  - ☐ Display signals with multiple clock domain inputs
  - ☐ Display combinatorial signals
  - ☒ Display unresolved signals
  - ☐ Display external signals
  - ☐ Display signals not checked for domain crossings
  - ☐ Display combinatorial logic fed by signals on different domains

- ☐ Display all signals in a specified domain
- ☐ Display all signals in a specified module
- ☐ Display hiearchy of a specified signal
- ☐ Display all flops using specified reset

- Display flops with invalid or missing reset
- Display signal table dump
- Display verilog keyword frequency Author:     Modified:

FIG. 8

METHOD AND APPARATUS FOR CHECKING ASYNCHRONOUS HDL CIRCUIT DESIGNS

BACKGROUND OF THE INVENTION

1. Technical Field

The invention relates to the design of integrated circuits. More particularly, the invention relates to a method and apparatus for checking asynchronous circuit designs that are expressed using a hardware description language (HDL).

2. Description of the Prior Art

The bulk of application specific integrated circuits (ASICs) today are designed using a hardware description language (HDL), such as Verilog or VHDL. Designs that are coded with HDL are independent of specific ASIC suppliers, libraries, and tools. It is this independence that makes the designs portable and reusable. In many cases, the design may have various sub-components or modules that may be new or that have been used many times before in other designs. However, the various modules may not all operate in the same clock domain. For example, a storage element (e.g. a flip-flop) in one module may be clocked from a different source than a storage element in a second module. For instance, an embedded microprocessor may be clocked at 33 MHz inside an ASIC, and an interface component, such as a local area network (LAN) controller may be clocked at 10 MHz. If signals are passed from one module to the other, care must be taken to synchronize the signals from the source to the clock domain of the target. This is shown in FIG. 1, which is a block schematic diagram of a circuit that includes a synchronizer 20 for synchronizing signals between disparate circuit elements, e.g. a microprocessor 10 and a LAN controller 30.

Circuits that are not operated in synchronism are referred to as asynchronous circuits. While asynchronous circuits may be introduced into various designs intentionally, it is highly undesirable to produce a design that includes unplanned asynchronous circuits. Accordingly, if the synchronization of signals passing between clock domains is overlooked, timing problems in the form of setup or hold violations can occur, resulting in metastable conditions in flip-flops used in the design. This condition can cause various functional problems in a design, such as data corruption, or it may cause state machines to hang or transition to illegal states. In designs that have a large number of modules or components, there could be hundreds of signals that require synchronization. As such, the possibility of missing a signal that requires synchronization increases as the size of a design increases.

There are several known methods for insuring that a design is free of any unplanned asynchronous circuits. One method provides clearly defined interfaces between modules and makes the modules adhere to strict synchronization requirements. This technique requires a well understood and documented interface or the intimate knowledge by the designer of the design and all other designs that may interface with the design. This is a presently preferred design approach, but does have its failings. For example, this approach puts a premium on well documented specifications. If documentation is not prepared or neglected, the above approach is neither comprehensive nor complete.

Because of the increased capability of systems to integrate functions into ASIC's, circuit designs are becoming more complex and much larger. Design teams may consist of several designers and, therefore, intimate knowledge of all modules in a design may be difficult for any individual designer to attain. Because it is no longer common, nor practical, to have a single designer for an ASIC, knowledge of a design must be as portable as the design itself. If a designer is no longer available for consultation, the intimate knowledge of the design is lost and incorrect assumptions may be made about the design. This approach also does not lend itself well to the use of third party intellectual property that may be available for use in a larger design because knowledge of such third party intellectual property may no longer be available for design purposes.

Another approach for checking a design for asynchronous behavior provides a rigorous design review by designers to detect oversights in synchronization methods and practices. This approach is manual and labor intensive in nature, and is prone to error due to designer's lack of familiarity with a design.

A secondary factor in increasing the chance of error is the complexity of the design itself and the corresponding file structure associated with the design. As discussed above, ASIC designs can comprise hundreds of modules that tend to be arranged hierarchically. FIG. 2 is a block schematic diagram of an ASIC design showing the hierarchical arrangement of modules within the design. One fundamental problem with checking for asynchronous circuitry in a design is that a hierarchy forces additional complexity into the design. Tracking signals from a destination device at level 2 in branch A (level2a.v) to a source device at level 3 in branch B (not shown) requires a designer to scan many files, tracking both destination clock and data.

As the number of design layers and the depth of the hierarchy increase, the verification process becomes more problematic. The task is further complicated if the signal names of the clock or data change from one module to the next. For example, it is allowable (and in some cases necessary) in the HDL language to call a signal, e.g. CLK33 at one level and CLK in another level.

It would be advantageous to provide an improved method and apparatus for checking asynchronous HDL circuit designs.

SUMMARY OF THE INVENTION

The invention provides a tool that automates and expedites the design review process. The invention allows designers to perform a comprehensive asynchronous path design review of the design's HDL code very early on in the design process. The tool operates on an entire hierarchy or any sub-block of the design. Filters are provided to allow the user to disregard known and desired synchronization circuits from the output generated by the tool. The tool provides an output that can take either of two formats, i.e. the output may be presented in a tabular form by hierarchical signal name, or it may be presented in a graphical, schematic block diagram form.

In operation, the tool performs an exhaustive search of all circuits and identifies any asynchronous behavior. This produces a higher quality design, allowing quicker time to market by reducing ASIC redesigns that result from design timing errors.

The tool has a simple user interface. The user interface requires only two user inputs and provides multiple program behavior modification options. The two mandatory fields identify the location of all design files and the module at which the tool should begin its analysis.

The tool begins its analysis at the level of the module input and traverses the design from that point down the hierarchy to all end modules.

BRIEF DESCRIPTION OF THE DRAWINGS

FIG. 8 is a schematic representation of a graphical user interface for the method and apparatus for checking asynchronous circuit designs according to the invention.

DETAILED DESCRIPTION OF THE INVENTION

The invention provides a tool that automates and expedites the ASIC design review process. The invention allows designers to perform a comprehensive asynchronous path design review of the circuit design's HDL code very early on in the design process. The tool operates on either an entire hierarchy or on any sub-block of the circuit design. Filters are provided to allow the user to disregard known and desired synchronization circuits from the output generated by the tool. The tool produces output that can take either of two formats, i.e. the output may be presented in a tabular form by hierarchical signal name (see below), or it may be presented in any desired graphical, schematic block diagram form (not shown) using well known display techniques.

In operation, the tool performs an exhaustive search of all circuits and identifies any asynchronous behavior. This produces a higher quality design, allowing quicker time to market by reducing ASIC redesigns that result from design timing errors.

The user interface requires two data inputs and provides for additional optional fields. The two mandatory fields identify the location of all design files and the module at which the tool should begin its analysis. The tool begins its analysis at the level of the module input and traverses the design from that point down the hierarchy to all end modules.

Figure 1:
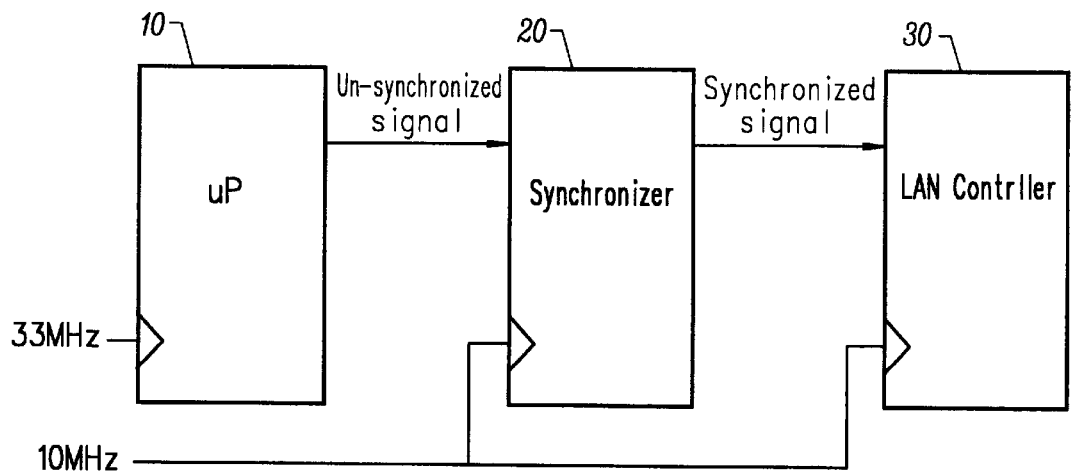
FIG. 1 is a block schematic diagram of a circuit that includes a synchronizer for synchronizing signals between disparate circuit elements.
Figure 2:
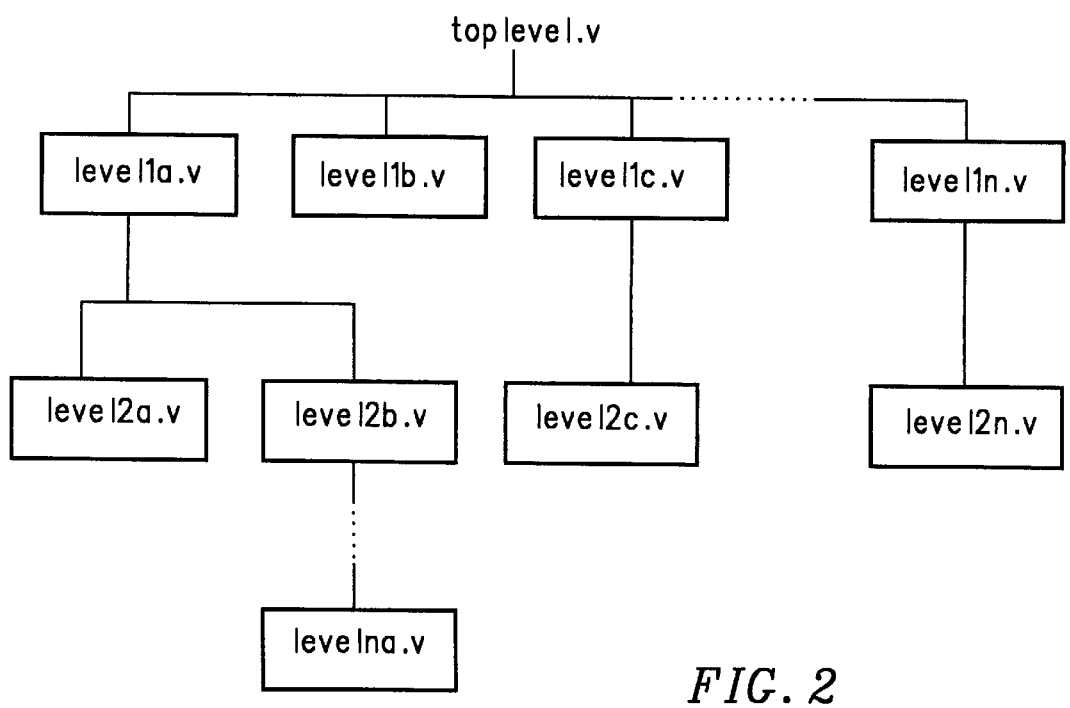
FIG. 2 is a block schematic diagram of an ASIC design showing the hierarchical arrangement of modules within the design.
Figure 3:
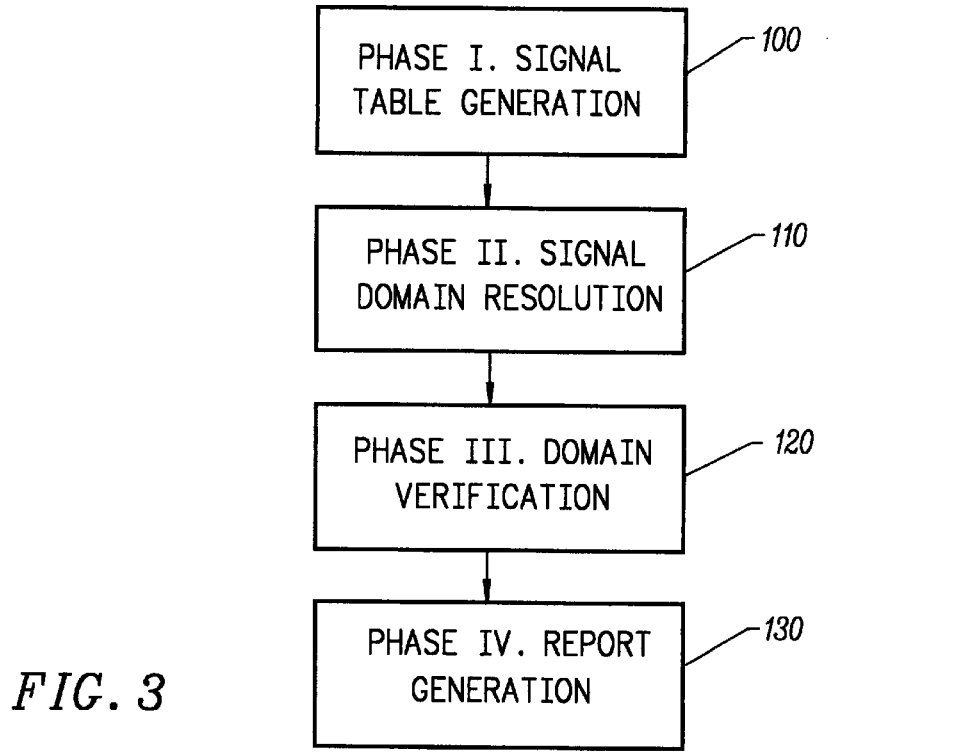
FIG. 3 is a flow diagram of a method and apparatus for checking asynchronous circuit designs that are expressed using the hardware description language (HDL) according to the invention.
Figure 4:
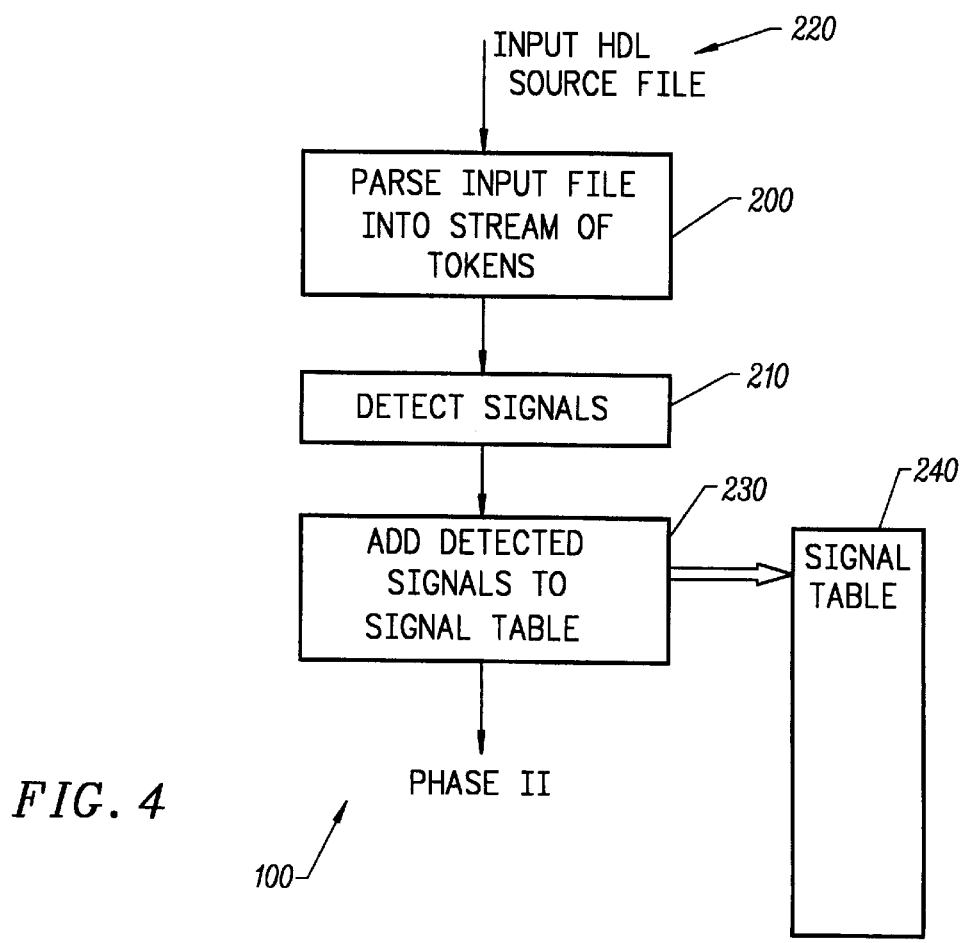
FIG. 4 is a flow diagram of a first phase of the method and apparatus for checking asynchronous circuit designs according to the invention.
Figure 5:
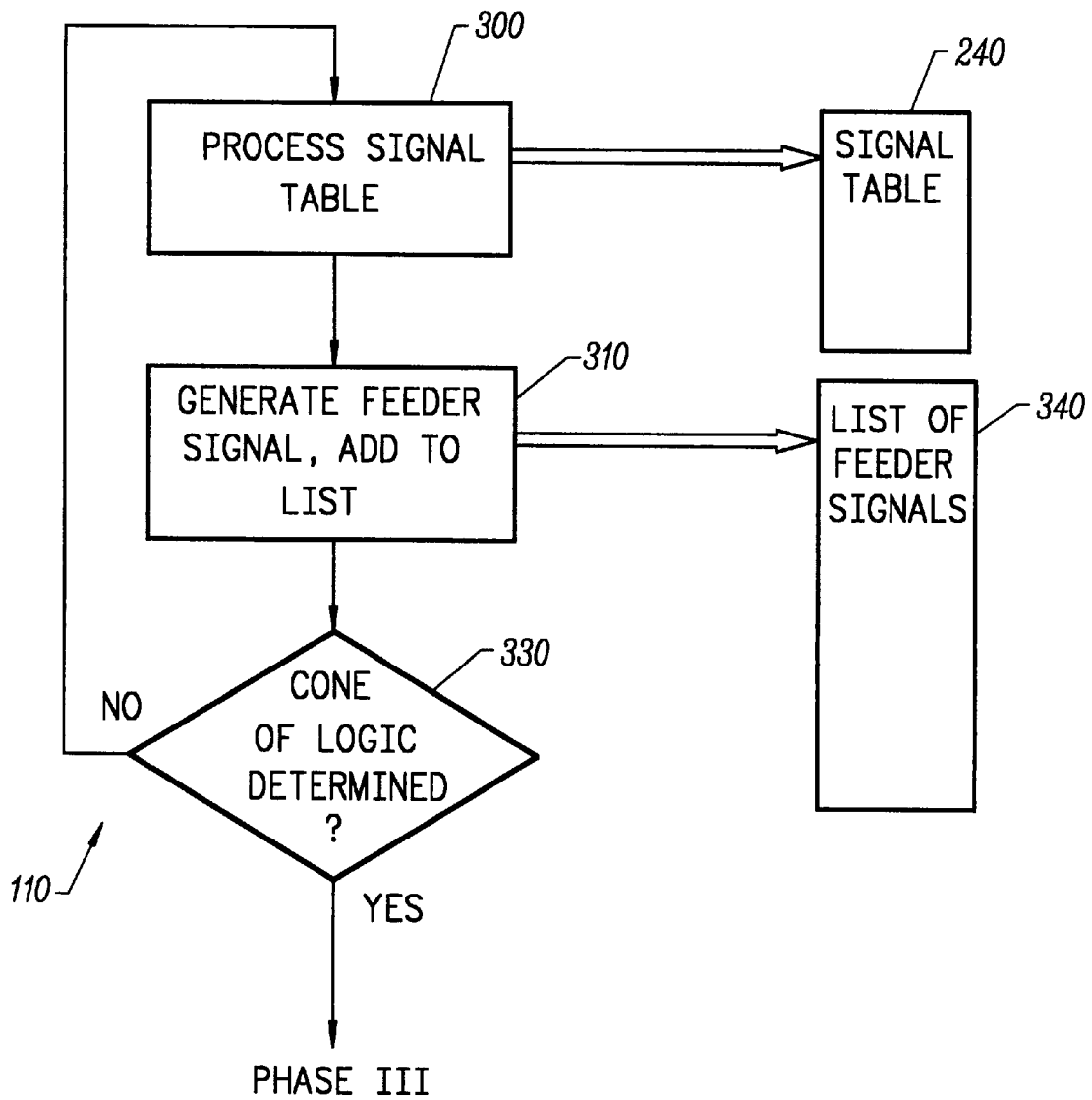
FIG. 5 is a flow diagram of a second phase of the method and apparatus for checking asynchronous circuit designs according to the invention.
Figure 6:
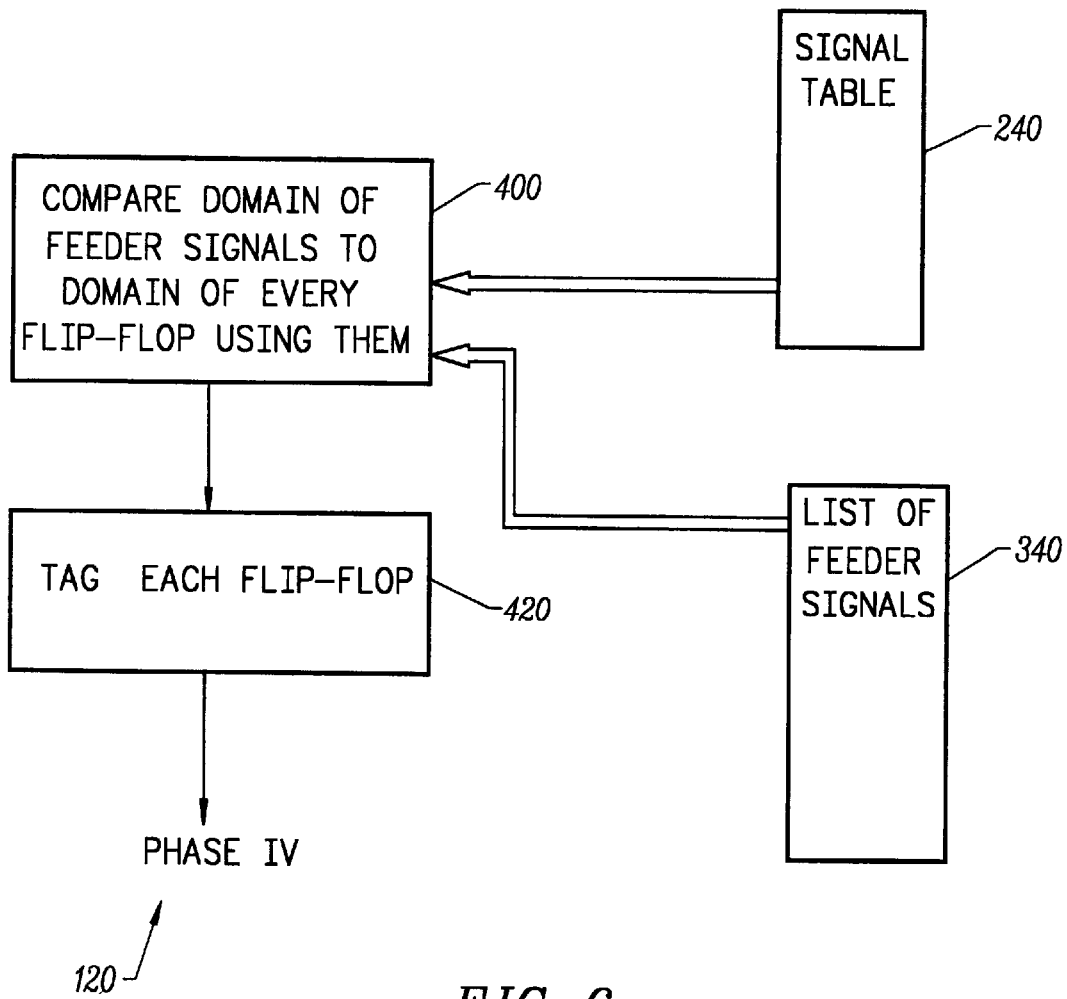
FIG. 6 is a flow diagram of a third phase of the method and apparatus for checking asynchronous circuit designs according to the invention.
Figure 7:
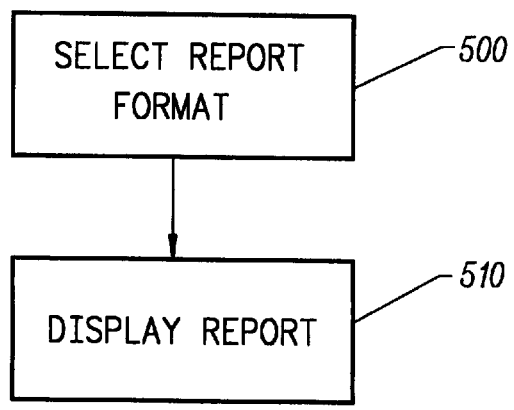
FIG. 7 is a flow diagram of a fourth phase of the method and apparatus for checking asynchronous circuit designs according to the invention.

The following discussion, in conjunction with FIGS. 3–7, identifies the logical flow of the herein described invention, i.e. the HDL asynchronous design checker. As shown in FIG. 3, operation of the design checker can be broken down into four major phases, i.e. Signal Table Generation (100), Signal Domain Resolution (110), Domain Verification (120), and Report Generation (130). Each phase is described below.

Phase I. Signal Table Generation (see FIG. 4)—During this phase, an input HDL source file (220) is parsed as a stream of tokens (200). As new signals are detected (210), they are added (230) to a signal table (240) and modified during the subsequent execution of the program. Module instantiations are processed as they are encountered.

Phase II. Signal Domain Resolution (see FIG. 5)—In this phase, the signal table (240) is processed (300) in multiple passes until the cone of logic behind each signal is completely determined (330). A list that includes feeder signals (340) for each signal is generated.

Phase III. Domain Verification (see FIG. 6)—The completed signal table (240) is used to compare (400) the domain of the feeder signals (340) to the domain of every flip-flop using them. Each signal is tagged (420) with a code describing the results of processing, as follows:

0)—Combinatorial logic fed from multiple sources;
1)—No domain violations (double-sync flop);
2)—Input from external source;
3)—Multiple clocks in feeder signal;
4)—Unable to resolve feeder signal(s);
5)—Feeder in one domain, flop-clock in another domain (domain crossing);
6)—Unknown problem with signal table (invalid domain entry);
X)—Incomplete information (unable to check domains); or
S)—Signal skipped (signal not considered for domain crossing).

Phase IV. Report Generation (see FIGS. 7 and 8)—Depending on the input parameters, one of several possible output formats can be selected (500) for display (510). These formats include:

A text based, colorized HTML format (Default);
A listing of all signals in a specified domain;
A listing of all signals in a specified module;
A hierarchical display of the cone of logic behind a specified signal;
A list of all modules reset by a specified reset signal;
A listing of detected potential reset problems;
A dump of the signal information database compiled during program execution;
A text only chart showing problem signals and their feeders;
A keyword frequency chart; and/or
Invalid or missing reset signals.

Program Options

The following options are provided in the presently preferred embodiment of the invention. It will be appreciated that additional options may be included as a matter of choice for one skilled in the art.

Display all signals: Selecting this options forces the invention to display all signals contained in a SigInfo database, along with a description of the problem code associated with each signal. Choosing this option is identical to selecting all options in the group of check boxes indented immediately below it except for the "Exclude tagged synchronous flops" (see FIG. 8, described below);

Display double synchronous flops: When this option is selected, signals that are completely synchronized (not at risk of domain crossing violations) are displayed;

Display domain crossing: Selected by default. When this option is selected, known domain crossing violations are displayed. If a signal is the output of the first stage of synchronization, it is still flagged as a domain crossing unless its name is prefixed by a user-defined filter pattern (i.e. sync) and the "Exclude tagged synchronous flops" option is selected;

Exclude tagged synchronous flops: This option is a modifier of the "Display domain crossing" option. When this option is selected, signals that would normally be considered as domain crossing violators are ignored, provided their name is prefixed by a user-defined filter pattern. (Multiple filter patterns can be defined in which case the signal will not be flagged if any filters match);

Display signals with multiple clock domain inputs: When selected, this option displays synchronous signals that have inputs residing in different clock domains;

Display combinatorial signals: This option forces the display of non-synchronous signals that are in a single clock domain. If a combinatorial signal has feed signals generated on more than one domain, the signal's output is governed by the "Display combinatorial logic fed by signals on different domains" option (discussed below);

Display unresolved signals: Selected by default. When this option is selected, signals that have not been completely determined by the invention are displayed. This only occurs if necessary information is not available;

Display external inputs: When a signal enters the highest level module, it is considered an input from the outside world and no assumptions about it are made. When this option is selected, all such inputs are shown;

Display signals not checked for domain crossings: Certain signals are not checked by the invention for domain crossing violations because it would not make sense to do so. These signals include external inputs and combinatorial logic. When this option is selected, these signals are displayed and tagged accordingly;

Display combinatorial logic fed by signals on different domains: When this option is selected, output signals from combinatorial logic whose inputs contain more than one clock source (or a mixture of synchronous and asynchronous signals) are displayed; and Display all domain names: Selecting this option will result in the invention displaying a list of all clock domains encountered and the signals residing in them.

FIG. 8 is a schematic representation of a graphical user interface for the method and apparatus for checking asynchronous circuit designs according to the invention. FIG. 8 shows various display options that are presented to a user during operation of the invention (as discussed above). It should be appreciated that the actual appearance of the user interface, as well of the particular display options presented to the user, is a matter of choice for one skilled in the art.

Command Line Format

The presently preferred command line format used in the invention is as follows:

DDr sourcefilepath modulename [-all_pcodes | -domain_x | -double_sync | -keyfreq_multi_clk_in | -show_domains | -no_syncs | -resets | -show_d [domain] | -show_mod [mod] | -show_reset [signals] | -show_sig [signal] | -sig_tab | -unresolved | -graphic Examples of Command Lines DDr /source/ verilog.v -graphic -all_pcodes: Generate an HTML listing of all flip-flops, showing the cone of logic behind each flip-flop. The flip-flop signal is hyper-text linked to a graphic showing the logic cloud with feeders to the flip-flop.

DDr /source/ verilog.v -sigtab -keyfreq -reset: Generates a text listing of flip-flops that may have domain crossings. Additionally, the signal table generated is displayed, along with a verilog keyword frequency table.

Sample Output

→ Q5 (clk2) [n_reset] comb1

→ Q2 (clk1) D1 (Extern) Q3 (clk2) D3 (Extern)

Key Word Assignments

Table 1 below shows key word assignments for a preferred embodiment of the invention.

TABLE 1

| Key Word Assignments | | |
|---|---|---|
| 0 | 9 | always |
| 2 | 3 | assign |
| 3 | 17 | begin |
| \\\\ | | |
| 51 | 8 | or |
| 52 | 3 | output |
| 64 | 4 | reg |
| 99 | 2 | wire |

EXAMPLE I

The following provides a Verilog input code example, the output produced by the invention during execution, and the table generated, as well as how the data from the table are generated.

Verilog Input Code

/* The following code has been developed to test the program

\* ddr.v ver 2.0

*/ module ddr (n_reset, clk1, clk2, D1, D3, Q7, Q8, Q9, out);

// Declare inputs input n_reset;

input clk1, clk2;

input D1;

input D3;

// Declare Module Outputs output Q7, Q8;

output Q9;

output out;

wire out;

reg Q7, Q8;

reg Q9;

// Declare internal signals reg Q1, Q2, Q3, Q4, Q5, Q6;

reg new_Q9;

wire comb1, comb2;

assign comb1=(Q2 & Q3);

assign comb2=(Q2 & Q4);

assign out=(Q5 & Q6);

always @ (Q5 or Q6)

begin new_Q9=(Q5 & Q6);

end // always @ (Q5 or Q6)

always @ (posedge clk1 or negedge n_reset)

if (n_reset)

begin

```
Q1=1'b0;
Q2=1'b0;
end // if (~n_reset)
else
begin
Q1=D1;
Q2=D1;
end // else: !if(~n_reset)
always @ (posedge clk2 or negedge n_reset)
if (~Q3)
begin
Q3=1'b0;
end // if (~n_reset)
else
begin
Q3=D3;
end // else: !if(~n_reset)
always @ (posedge clk1 or negedge n_reset)
if (~n_reset)
begin
Q4=1'b0;
end // if (~n_reset)
else
begin
Q4=Q1;
end // else: !if(~n_reset)
always @ (posedge clk2 or negedge n_reset)
if (~n_reset)
begin
Q5=1'b1;
end // if (~n_reset)
else
begin
Q5=comb1;
end // else: !if(~n_reset)
always @ (posedge clk1 or negedge n_reset)
if (~n_reset)
begin
Q6=1'b0;
end // if (~n_reset)
else
begin
Q6=comb1;
end // else: !if(~n_reset)
always @ (posedge clk1 or negedge n_reset)
if (~n_reset)
begin
Q7=1'b0;
end // if (~n_reset)
else
begin
Q7=comb2;
end // else: !if(~n_reset)
always @ (posedge clk2 or negedge n_reset)
if (~n_reset)
begin
Q8=1'b1;
end // if (~n_reset)
else
begin
Q8=comb2;
end // else: !if(~n_reset)
always @ (negedge clk1 or negedge n_reset)
if (~n_reset)
begin
Q9=1'b0;
end // if (~n_reset)
else
begin
Q9=new_Q9;
end // else: !if(~n_reset)
endmodule
```

Example of Output During Program Execution
Processing Command Line . . .
   Options selected:
   -all_pcodes
   -show_d[clk2 ]
   -show_mod[ddr]
   -show_sig[out]
   -show_reset [n_reset]
   -resets
   -sig_tab
   -keyfreq
Starting Phase I (Source file parsing) . . .
   Parsing (Top) /mnt/hci4/test/ddr.v
Processing Module ddr . . .
Warning: Invalid reset in /mnt/hci4/test/ (ddr).
   Expected n_reset, found Q3
Module ddr processed.
Phase I Complete. Starting Phase II
   Resolving clock domains
Starting pass 1
Q1 Feed domain changed from (!) to (Extern)
Q2 Feed domain changed from (!) to (Extern)
Q3 Feed domain changed from (!) to (Extern)
Q4 Feed domain changed from (!) to (clk1)
comb1 Feed domain changed from (!) to (MULT)
comb2 Feed domain changed from (!) to (clk1)
new_Q9 Feed domain changed from (!) to (MULT)
out Feed domain changed from (!) to (MULT)
Starting pass 2
Q5 Feed domain changed from (!) to (MULT)
Q6 Feed domain changed from (!) to (MULT)
Q7 Feed domain changed from (!)to (clk1)
Q8 Feed domain changed from (!) to (clk1)
Q9 Feed domain changed from (!) to (MULT)
Starting pass 3

Phase II Complete. Starting Phase III
(Looking for domain crossings). . .

Q1 -- Unknown Domain (External signal)
Q2 -- Unknown Domain (External signal)
Q3 -- Unknown Domain (External signal)
Q5 -- Multiple clocks in feeder signal
Q6 -- Multiple clocks in feeder signal
Q8 -- Feeder in one domain, Flop in another
Q9 -- Multiple clocks in feeder signal -continued Phase III Complete.

| Signal:D1 | Resolution Code:S |
|---|---|
| Signal:Q1 | Resolution Code:2 |
| Signal:Q2 | Resolution Code:2 |
| Signal:Q3 | Resolution Code:2 |
| Signal:Q4 | Resolution Code:1 |
| Signal:Q5 | Resolution Code:3 |
| Signal:Q6 | Resolution Code:3 |
| Signal:Q7 | Resolution Code:1 |
| Signal:Q8 | Resolution Code:5 |
| Signal:Q9 | Resolution Code:3 |
| Signal:clk1 | Resolution Code:S |
| Signal:clk2 | Resolution Code:S |
| Signal:comb1 | Resolution Code:0 |
| Signal:comb2 | Resolution Code:S |
| Signal:n_reset | Resolution Code:S |
| Signal:new_Q9 | Resolution Code:0 |
| Signal:out | Resolution Code:0 |

Output of Table Generation

Table 2 below is an example output table generated by the invention.

TABLE 2

Example Output of Table Generation.

| Signal | Signal Domain | List Domain | Type | Dir | Clk | Port | Reset | Feeds |
|---|---|---|---|---|---|---|---|---|
| D1 | None | Extern | Wire | In | Extern | True | Ext | None |
| D3 | None | Extern | Wire | In | Extern | True | Ext | None |
| Q1 | Ext | clk1 | Reg | * | +Clk | * | — | D1 |
| Q2 | Ext | clk1 | Reg | * | +Clk | * | — | D1 |
| Q3 | Ext | clk2 | Reg | * | +Clk | * | — | D3 |
| Q4 | clk1 | clk1 | Reg | * | +Clk | * | — | Q1 |
| Q5 | MC | clk2 | Reg | * | +Clk | * | — | comb1 |
| Q6 | MC | clk1 | Reg | * | +Clk | * | — | comb1 |
| Q7 | clk1 | clk1 | Reg | Out | +Clk | True | — | comb2 |
| Q8 | clk1 | clk2 | Reg | Out | +Clk | True | — | comb2 |
| Q9 | MC | clk1 | Reg | Out | −Clk | True | — | new_Q9 |
| clk1 | None | Extern | Wire | In | Extern | True | Ext | None |
| clk2 | None | Extern | Wire | In | Extern | True | Ext | None |
| comb1 | MC | Async | Wire | * | Comb | * | None | Q2, Q3 |
| comb2 | clk1 | Async | Wire | * | Comb | * | None | Q2, Q4 |
| n_reset | None | Extern | Wire | In | Extern | True | Ext | None |
| new_Q9 | MC | Async | Reg | * | Comb | * | * | Q5, Q6 |
| out | MC | Async | Wire | Out | Comb | True | None | Q5, Q6 |

*MC = Multiple Clocks

Done
Analysis of Example Output

The clock domain of the Q8 flop output was found to be clk2 during phase I of processing. Also during phase I, comb2 was detected as the only feeder to Q8—and Q2 and Q4 were feeds to comb2.

During phase II, all feeder signal domains were resolved (i.e. comb2 uses Q2 and Q4, which are both clocked by clk1, so comb2 is considered to be in the clk1 domain). Because the only feeder into Q8 is comb2, the feed domain is considered to be clk1.

During phase III, the domain of the feeder(clk1) is checked against the flop's clock domain(clk2). Because they do not match, Q8 is flagged with the following error:

Feeder signals in one clock domain, flop-clock on another.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. An apparatus for performing an asynchronous path design review of a circuit design's HDL code, comprising:
a tool that performs an exhaustive search of all circuits in said HDL code and that identifies any asynchronous behavior; said tool comprising:
a signal table generation module for use during a first phase of design review, wherein said signal table generation module parses an input source file as a stream of tokens such that, as new signals are detected, said signals are added to a signal table for subsequent modification;
a signal domain resolution module for use during a second phase of design review, wherein said signal domain resolution module processes said signal table in multiple passes until a cone of logic behind each signal is completely determined;
a domain verification module for use during a third phase of design review, wherein said domain verification module uses a completed signal table to compare domain of feeder signals to a domain of every flip-flop using such feeder signal; and
a report generation module for use during a fourth phase of design review, wherein said report genera-
tion module produces any one or more possible output formats for display.

2. The apparatus of claim 1, wherein said tool operates on either an entire hierarchy or on any sub-block of said circuit design.

3. The apparatus of claim 1, wherein said tool produces an output that is presented in any of a tabular form by hierarchical signal name and in any desired graphical, schematic block diagram form.

4. The apparatus of claim 1, further comprising:
a user interface requires two data inputs, wherein said user interface provides for multiple optional fields.

5. The apparatus of claim 4, wherein said two required data inputs identify both a location of all design files and a module at which said tool should begin its analysis.

6. The apparatus of claim 1, wherein said tool begins its analysis at the level of a module input and traverses said design from that point down a hierarchy to all end modules.

7. The apparatus of claim 1, wherein module instantiations are processed as they are encountered.

8. The apparatus of claim 1, wherein clock domains are recorded in said signal table.

9. The apparatus of claim 1, wherein each signal is tagged with a code describing the results of processing.

10. The apparatus of claim 9, wherein said tags comprise any of the following:
   0)—Combinatorial logic fed from multiple sources;
   1)—No domain violations (double-sync flop);
   2)—Input from external source;
   3)—Multiple clocks in feeder signal;
   4)—Unable to resolve feeder signal(s);
   5)—Feeder in one domain, flop-clock in another domain (domain crossing);
   6)—Unknown problem with signal table (invalid domain entry);
   X)—Incomplete information (unable to check domains); and
   S)—Signal skipped (signal not considered for domain crossing).

11. The apparatus of claim 1, wherein said output formats comprise any combinations of the following:
   a text based, colorized HTML format;
   a graphic representation of domains using flipflop and combinatorial symbols;
   a listing of all signals in a specified domain;
   a listing of all signals in a specified module;
   a hierarchical display of the cone of logic behind a specified signal;
   a list of all modules reset by a specified reset signal;
   a listing of detected potential reset problems;
   a dump of a signal information database compiled during program execution;
   a text only chart showing problem signals and their feeders;
   a keyword frequency chart;
   a list of all domains detected during program execution; and
   invalid reset signals which are displayed during program execution.

12. The apparatus of claim 1, wherein said report generation module further comprises at least one of the following options:
   display all signals;
   display double synchronous flops;
   display domain crossings;
   exclude tagged synchronous flops;
   display signal with multiple clock domain inputs;
   display combinatorial signals;
   display unresolved signals;
   display external inputs;
   display signals not checked for domain crossings; and
   display combinatorial logic fed by signals on different domains.

13. A method for performing an asynchronous path design review of a circuit design's HDL code, comprising the steps of:
   providing a tool for said review; said tool providing step comprising the steps of:
      providing a signal table generation module for use during a first phase of design review, wherein said signal table generation module parses an input source file as a stream of tokens such that, as new signals are detected, said signals are added to a signal table for subsequent modification;
      providing a signal domain resolution module for use during a second phase of design review, wherein said signal domain resolution module processes said signal table in multiple passes until a cone of logic behind each signal is completely determined;
      providing a domain verification module for use during a third phase of design review, wherein said domain verification module uses a completed signal table to compare a domain of feeder signals to a domain of every flip-flop using such feeder signal; and
   providing a report generation module for use during a fourth phase of design review, wherein said report generation module produces any one or more possible output formats for display;
   performing an exhaustive search of all circuits in said HDL code with said tool; and
   identifying any asynchronous behavior with said tool.

14. The method of claim 13, wherein said tool operates on either an entire hierarchy or on any sub-block of said circuit design.

15. The method of claim 13, wherein said tool provides produces output that is presented in any of a tabular form by hierarchical signal name and in any desired graphical, schematic block diagram form.

16. The method of claim 13, further comprising the step of:
   providing a user interface that requires two data inputs and that provides for multiple optional fields.

17. The method of claim 16, wherein said two required data inputs identify a location of all design files and a module at which said tool should begin its analysis.

18. The method of claim 16, wherein said output formats comprise any of the following:
   a text based, colorized HTML format;
   a listing of all signals in a specified domain;
   a listing of all signals in a specified module;
   a hierarchical display of a cone of logic behind a specified signal;
   a list of all modules reset by a specified reset signal;
   a listing of detected potential reset problems;
   a dump of a signal information database compiled during program execution;
   a text only chart showing problem signals and their feeders;
   a keyword frequency chart;
   a list of all domains detected during program execution; and
   invalid reset signals which are displayed during program execution.

19. The method of claim 16, wherein said report generation module further comprises at least one of the following options:
   display all signals;
   display double synchronous flops;
   display domain crossings;
   exclude tagged synchronous flops;
   display signal with multiple clock domain inputs;
   display combinatorial signals;
   display unresolved signals;
   display external inputs;

display signals not checked for domain crossings; and display combinatorial logic fed by signals on different domains.

20. The method of claim 13, wherein said tool begins its analysis at the level of a module input and traverses said design from that point down a hierarchy to all end modules.

21. The method of claim 20, wherein module instantiations are processed as they are encountered.

22. The method of claim 20, wherein each signal is tagged with a code describing the results of processing.

23. The method of claim 22, wherein said tags comprise any of the following:

0)—Combinatorial logic fed from multiple sources;

1)—No domain violations (double-sync flop);

2)—Input from external source;

3)—Multiple clocks in feeder signal;

4)—Unable to resolve feeder signal(s);

5)—Feeder in one domain, flop-clock in another domain (domain crossing);

6)—Unknown problem with signal table (invalid domain entry);

X)—Incomplete information (unable to check domains); and

S)—Signal skipped (signal not considered for domain crossing).

* * * * *

UNITED STATES PATENT AND TRADEMARK OFFICE
CERTIFICATE OF CORRECTION

PATENT NO.    : 6,099,579
DATED         : August 8, 2000
INVENTOR(S)   : Dowling et al.

It is certified that error appears in the above-identified patent and that said Letters Patent is hereby corrected as shown below:

<u>Column 10,</u>
Line 20, after "compare" insert -- a --

<u>Column 13,</u>
Lines 7 and 9, delete "claim 20" and insert therefor -- claim 13 --

Signed and Sealed this

Tenth Day of June, 2003

JAMES E. ROGAN
*Director of the United States Patent and Trademark Office*